United States Patent
Visweswariah et al.

(10) Patent No.: US 8,732,642 B2
(45) Date of Patent: May 20, 2014

(54) METHOD FOR ACHIEVING AN EFFICIENT STATISTICAL OPTIMIZATION OF INTEGRATED CIRCUITS

(75) Inventors: Chandramouli Visweswariah, Croton-on-Hudson, NY (US); Eric Fluhr, Round Rock, TX (US); Stephen G. Shuma, Underhill, VT (US); Debjit Sinha, Wappingers Falls, NY (US); Michael H. Wood, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/564,751

(22) Filed: Aug. 2, 2012

(65) Prior Publication Data

US 2014/0040844 A1    Feb. 6, 2014

(51) Int. Cl.
*G06F 9/455*    (2006.01)

(52) U.S. Cl.
USPC ............................. 716/113; 716/55; 716/132

(58) Field of Classification Search
USPC ........................................... 716/55, 113, 132
See application file for complete search history.

(56) References Cited

U.S. PATENT DOCUMENTS

| | | | |
|---|---|---|---|
| 7,512,919 B2 | 3/2009 | Visweswariah | |
| 7,689,954 B2 * | 3/2010 | Zhang et al. | 716/113 |
| 8,010,921 B2 | 8/2011 | Visweswariah | |
| 8,141,025 B2 * | 3/2012 | Sinha et al. | 716/134 |

* cited by examiner

*Primary Examiner* — Thuan Do
(74) *Attorney, Agent, or Firm* — H. Daniel Schnurmann

(57) ABSTRACT

Method for performing timing closure of integrated circuits in the presence of manufacturing and environmental variations. The starting design is analyzed using statistical static timing analysis to determine timing violations. Each timing violation in its statistical canonical form is examined. In a first aspect of the invention, the canonical failing slack is inspected to determine what type of move is most likely to fix the timing violation taking into account all relevant manufacturing and environmental variations. In a second aspect of the invention, pre-characterized moves such as insertion of delay pad cells are evaluated for their ability to fix the timing violation without triggering timing, and the best move or set of moves is selected.

16 Claims, 2 Drawing Sheets

METHOD FOR ACHIEVING AN EFFICIENT STATISTICAL OPTIMIZATION OF INTEGRATED CIRCUITS

FIELD OF THE INVENTION

The present invention relates to the design and optimization of integrated circuits. More particularly, it relates to Electronic Design Automation of integrated circuits, and yet, more specifically, to a system and methods of achieving timing closure during the design of integrated circuits while taking manufacturing and environmental variations into account.

BACKGROUND OF THE INVENTION

Timing closure refers to the process of making changes to an initial integrated circuit design to get rid of timing violations. Typically, a static timing analysis software tool is employed to determine all the timing violations. Changes are made to improve the design and static timing analysis is iteratively invoked until all violations have been addressed. These changes are also referenced to as "moves." Making moves to improve the timing of the circuit will be referred hereinafter as optimization.

Examples of changes made to achieve timing closure include buffer insertion, gate sizing, assignment of wires to metal layers, pin swapping and pad cell (or "delay cell") insertion. Some moves improve the timing characteristics of the design and others make timing worse, so that the timing closure process is often "timing driven", meaning that the static timer is queried to determine which changes improve the design and which do not. In general, the iterative implementation of changes in a timing-driven manner can be made manually by a designer, or by a software Electronic Design Automation tool.

For an integrated circuit to be free of timing violations, numerous timing tests associated with the circuit design must be met. Associated with each timing test is a timing slack, which is computed by the static timing analysis (STA) tool. Positive slack signifies that the timing is met, and negative slack implies a timing violation. The process of optimization consists of iteratively making moves until a positive slack is achieved for each timing test. STA software tool typically supports slack queries to aid in the optimization process.

Manufacturing and environmental variations significantly complicate the timing closure. Manufacturing variations will be referenced hereinafter as "process variations." Variations are handled by an STA program by utilizing either multi-corner methods or statistical embodiments. The corner is a unique setting of process and environmental variables, and multi-corner timing implies that timing analysis is repeated at multiple corners and the worst (i.e., smallest) slack across all corners must be positive for closure. In a statistical timing, some or all variations are treated statistically, i.e., as probability distributions. The resulting statistical slack is "projected" to obtain the worst slack across the space of manufacturing and environmental variations, and the statistical slack must be positive to achieve closure.

For conventional optimization methods, timing are queried after every move, and the moves that result in an improved timing are accepted, while those that worsen the timing are rejected. One timing test is targeted at a time and various moves are tried in an iterative manner until either a positive slack is achieved or the present timing test is skipped in order to make progress on other timing tests. In this conventional method, the static timing analysis software typically updates timing information incrementally to answer timing queries made after each move. Incremental timing implies that the timing tool performs minimal computation in order to answer the timing query after a circuit change. In another conventional method, a plurality of moves is "batched up" and timing is then checked after applying all the changes to the design.

Both conventional methods suffer from significant drawbacks. In the aforementioned first method, the computer run time of updating timing and answering timing queries after each design change can be prohibitive, because millions of changes can be attempted in a single optimization run and timing queries must be answered every single time. A second drawback is that each proposed change provides a different amount of benefit at different process corners. If the multi-corner or statistical timing must be repeated to evaluate the benefit of each proposed change, the computational burden can become overwhelming. If single corner timing is used to guide the optimization, then the timing violations at other corners may not be addressed and may in fact get worse. Thus, the optimization may improve the timing at the single corner considered, but make timing worse at other corners, and may "ping pong" back and forth without making any real progress. This drawback of prior art embodiments highlights the difficulty of timing closure in the presence of variations. A third weakness of prior art methods is that there is no easy way to decide which type of move is most effective in any given situation.

Programs will typically try either buffering or sizing or layer assignment or other types of moves in different heuristically selected orders to see which yields most benefit. The selected order applies to all timing violations. Presently, violations that benefit from a different order of moves cannot be achieved with conventional methods. As a result, conventional embodiments are inefficient due to applying the same order of types of moves to all the timing violations. This inefficiency manifests itself as longer run times and sub-optimal results in terms of timing, power and area of the integrated circuit. The heuristic ordering of moves makes the optimization results inconsistent, untrustworthy and subject to chance.

Other conventional methodologies also suffer from another significant drawback. As moves are accepted and design changes are implemented, the timing information corresponding to the changed circuit is not available. Therefore, there is no clear timing guidance for the rest of the moves in the "batch" of moves. As in this conventional embodiment, there is no guarantee that various corners or portions of the space of manufacturing variations will have fixed timing violations. As previously stated, there is no intuitive approach for which type of change will be most beneficial in any given situation.

Conventional embodiments often use exhaustive methods. For example, all sizes of a buffer may be inserted one at a time with a timing query following each insertion to determine the best size. In many instances, they are limited by the use of heuristic methods to optimize moves in various different orders to fix the timing violations. For instance, conventional methods may use delay pad cell insertion first, followed by buffering, gate sizing and finally pin swapping. The heuristic order is applied to all the timing violations, which is wasteful because different timing violations benefit from different types of moves, and trying moves in the same order across all the timing violations, which is inefficient.

Thus prior art embodiments have a relatively low fraction of moves that are accepted, and they create sub-optimal designs by inserting buffers, in instances where gate sizing may be a more efficient way to fix a particular timing violation.

In view of these and other reasons, conventional embodiments have failed to achieve timing closure in the presence of manufacturing and environmental variations, and suffer from significant drawbacks.

Accordingly, methods have been proposed in the literature, but generally have not been practiced in industry. Thus, there is a need for methods capable of providing a statistical optimization of integrated circuit designs.

BRIEF DESCRIPTION OF THE DRAWINGS

The foregoing and other objects, aspects and advantages will be better understood and appreciated more fully from the following detailed description of preferred embodiments of the invention, taken in conjunction with the accompanying drawings which include the following.

SUMMARY

Figure 1:
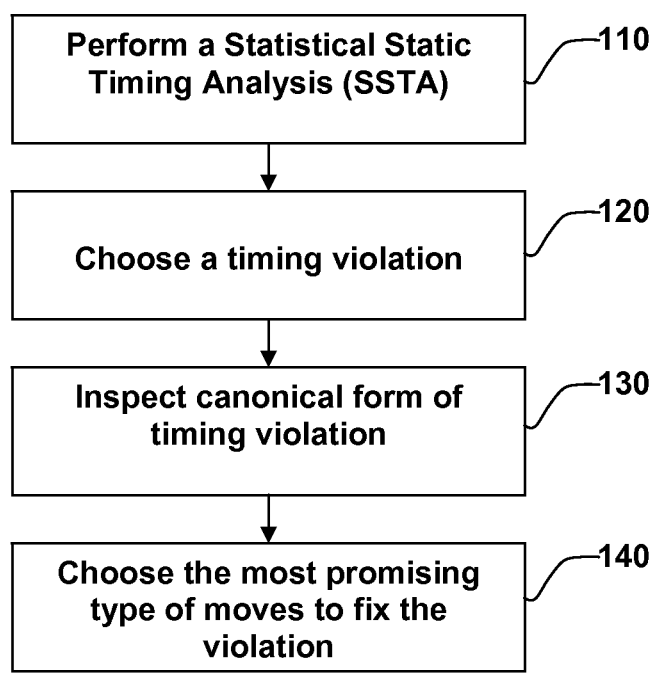
FIG. 1 is a flow chart illustrating a method that achieves timing closure by choosing the most promising type of moves to fix a timing violation, according to one embodiment of the invention.

The present invention is a system and method for achieving timing closure in the presence of manufacturing and process variations. After an initial statistical timing analysis, timing slacks are available in canonical form. In an embodiment of the present invention, each timing violation is inspected to determine the right type of move or set of moves that are most likely to fix the timing violation, and this type of move or set of moves is prioritized for each timing violation. The end result is a more efficient timing closure procedure, reduced computational resources, and designs with fewer timing violations, lower area and lower power. Violations at all relevant corners of the space of variations are addressed simultaneously.

In one aspect, the invention provides a system and a method for achieving timing closure in the presence of manufacturing and process variations. After an initial statistical timing analysis, timing slacks are available in canonical form.

In a further aspect of the invention, each timing violation is inspected to determine the right type of move or set of moves that are most likely to fix the timing violation, having the type of move or set of moves prioritized for each timing violation. The end result is a more efficient timing closure procedure, reduced computational resources, and designs with fewer timing violations, a lower area and lower power. Violations at all relevant corners of the space of variations are addressed simultaneously.

In yet another aspect, various moves are pre-characterized to understand how much of timing improvement (or "goodness") each move can offer. For example, the additional delay provided with a delay pad cell determines its goodness in terms of being able to fix hold timing violations. A hold timing violation occurs when a data signal arrives at a sequential element too soon, and it is typically fixed by inserting delay cells to slow down the data path. Pre-characterization of moves is performed across the space of manufacturing and environmental variations. During timing closure, moves are evaluated by using their goodness functions. Multiple moves can be combined to determine which combination of goodness functions is sufficient to fix the original timing violation. These evaluations can be made without triggering timing. In one embodiment, multiple moves can be evaluated simultaneously.

In a further aspect of the invention, multiple moves are evaluated "on the side" without triggering timing, and the best move or moves are implemented in the design. As a result, the iteration inherent in achieving design closure is reduced, and a higher percentage of moves are accepted. Further, timing is triggered only for a promising move or set of moves. In one embodiment, violations at all relevant corners of the space of variations are addressed simultaneously.

In yet a further aspect, there is provided a method for achieving timing closure of a design of VLSI circuits in presence of manufacturing and environmental variations, the method including: analyzing the design using STA and identifying timing violations; examining each of the timing violations in a statistical canonical form; determining from the canonical form an optimization move to fix the timing violation; and applying the move to the timing violation location.

In still a further aspect, there is provided a method of achieving timing closure of integrated circuits that includes: selecting a failing timing test for optimizing moves; inspecting a slack of the failing timing test in canonical form; and using pre-characterized goodness of the optimized moves to determine the best move or set of moves.

DETAILED DESCRIPTION

Referring to FIG. 1, a flowchart (100) illustrates one embodiment of the present invention. A statistical static timing analysis is performed on a circuit design (step 110), and the statistical slack is preferably computed for all the timing tests in canonical form. The canonical form allows evaluating the slack across the entire space of the sources of variation (i.e., at any and all "corners" of the sources of variation). This helps identifying the regions in the space of the sources of variation where a timing violation exists.

For illustrative purposes, a typical canonical form takes the form of $a_0 + a_1 \Delta X_1 + \ldots + a_n \Delta R$, where $a_0$ is the nominal or mean value of the slack in the absence of variation; $a_1$ through $a_{n-1}$ are sensitivities to global sources of variation $\Delta X_1$ through $\Delta X_{n-1}$, respectively; and the last term is independently random variation.

In step 120, a timing violation is selected for optimization.

In step 130, the canonical form of the slack of the timing violation is inspected. The mean value is indicative of how much of a traditional timing deficit exists, and the sensitivities determines how much of the deficit is due to variations, and which sources of variation are the most important, a crucial information that will be used in the next step to tailor the type of optimization moves to the particular timing test.

In step 140, a most promising type of move is selected to fix the timing violation. By way of example, in the case of a high metal sensitivity, inserting buffers are deemed to be a promising type of move. If one particular layer of metal has a high sensitivity, then routing on other metal layers will be helpful. If there is strong NPskew sensitivity (i.e., a measure of sensitivity of slack to mistracking between NFET and PFET strengths), then breaking down complex P-stacks may be indicated. If there is a large component of random sensitivity, using larger and more complex cells in the critical path is a promising move. Thus, the sensitivities in the canonical form are exploited to determine the best move type in order to make the timing closure procedure more efficient, in contrast to other embodiments that apply the same order to all the timing violations, that is not only inefficient, but which can cause harm by increasing power and worsening the timing.

It is to be understood that the aforementioned flow chart is an illustrative examples, and is not limited to it, since adapting to different situations may depend on how the variations are modeled. The canonical slacks give a clear indication of which move types are the most promising in any given situation as described in the examples above. It is to be understood that the embodiment can be extended to choosing multiple move types that are most promising for a given timing violation. It is to be understood that if multi-corner timing is used for checking timing violations, a canonical form of the slack can be constructed from the value of slack at various corners before applying the present invention.

Figure 2:
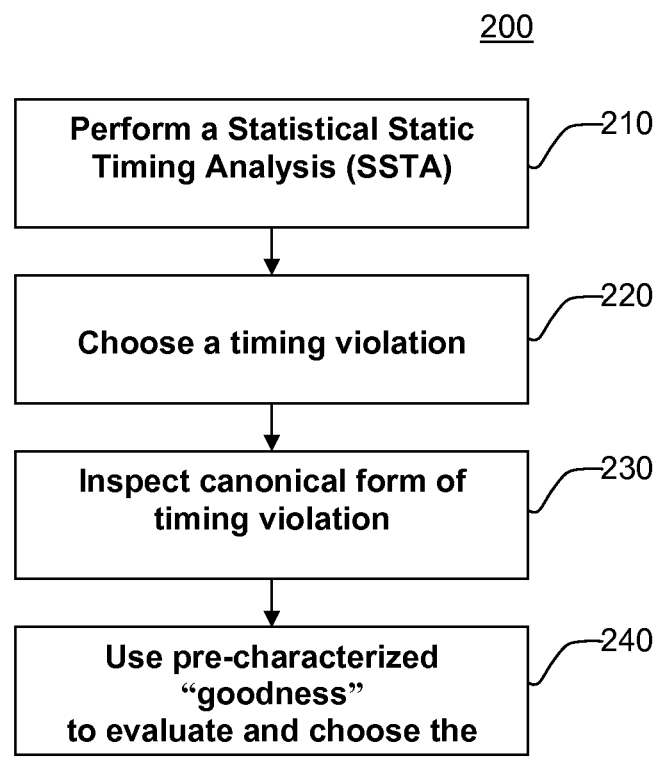
FIG. 2 is a flow chart showing a second embodiment to achieve timing closure by selecting the most promising moves to fix a timing violation.

FIG. 2 is a flowchart (200) illustrating a second aspect of the present invention. Statistical static timing analysis is performed on the circuit design (step 210) to obtain all timing test slacks in canonical form.

In step 220, a timing violation is selected for optimization.

In step 230, the canonical slack of the timing violation is inspected. As previously stated, the various terms of the canonical form are available for use.

In step 240, the best move or set of moves is selected for the timing violation. The method for making this choice is explained in detail hereinafter. The example of delay padding to fix hold time violations is used, but the concept applies to any type of timing violation. Prior to the start of the optimization, the amount by which each move can improve timing is pre-characterized while taking into account variations. The amount of improvement is called "goodness." The goodness of each move is characterized in a fully canonical form for use in conjunction with statistical timing. For example, the additional delay provided by a delay pad cell is pre-characterized in canonical form. This allows the computation of the "goodness" at each corner of the variation space by projecting the canonical form to that corner. Goodness of other moves like metal layer changes or size changes can similarly be pre-characterized. Of particular interest is the projection used by the timing methodology for achieving closure, since that is the criterion for sign-off.

Example 1

Consider an early mode timing test slack of $S=-5+2\Delta X_1-\Delta X_2+\Delta R$ in a timing methodology in which there are two global sources of variation, and worst-case projection is used for timing sign-off. The worst-case projection of slack S is $-5+2(-3)-(-3)+(-3)=-17$ ps which is obtained by projecting each source of variation to either plus or minus 3 sigma, whichever makes the slack worse (smaller). Consider a delay pad cell whose goodness has been pre-characterized as $D_1=7-\Delta X_1+\Delta X_2+\Delta R$. Then, the following equation for a slack after inserting one delay pad cell is provided, wherein: $S+D_1=2+\Delta X_1+\sqrt{2}\Delta RR$ with a worst-case projection of $-5.2$ ps. After inserting two delay pad cells one obtains $S+2D_1=9+\Delta X_2+\sqrt{3}\Delta R$ with a worst-case projection of $+0.9$ ps, which would fix the timing violation. If three pad cells were to be inserted, one would obtain $S+3D_1=16-\Delta X_1+2\Delta X_2+2\Delta R$ with a worst-case projection of $+1.0$ ps. Thus, it is seen in the present example that one can determine that two pad cells give the best solution, and that one can reach this conclusion with a "what if" side calculation which is a significantly more efficient than triggering the timer. One can also observe that because of the way process sensitivities interact, adding a third delay cell gains very little.

Example 2

Consider a timing test slack of $S=-5+2\Delta X_1-\Delta X_2+\Delta R$ with a worst-case projection of $-17$ ps as before. Consider a situation where there are two delay pad cells available. The first cell has a goodness function $D_1=4-\Delta X_1+\Delta X_2+\Delta R$, and is a relatively inexpensive cell to use in terms of area or power. The other pad cell has a goodness function $D_2=7-\Delta X_1+\Delta R$ and is relatively expensive in terms of area or power. Using algebra, one finds that $S+D_1+D_2=6+\sqrt{3}\Delta R$ with a worst-case projection of $+0.9$ ps, implying that in this instance, the combination of one cheap and one costly pad cell will succeed and achieve a positive slack. The example demonstrates the timing benefits of sensitivity cancellation since the combination of one of each of the two types of pad cells completely cancels out global variation in the slack, leaving only independently random variation. This allows for an efficient fix to the original timing violation.

General formulation: The two prior examples illustrate how the best move or set of moves can be selected in step 240. While the examples dealt with hold violations and the scenario of inserting delay pad cells, the concept can be extended to any type of timing violation and any type of optimization move. The general formulation of the "what if" or "side computation" required is as a knapsack problem is described below:

Given a canonical slack S which constitutes a timing violation;

Given optimization moves or alternatives with pre-characterized canonical goodness functions $D_i$, i=1, 2, ..., n and cost $c_i$, i=1, 2, ..., n;

Find a non-negative integer number $p_i$, i=1, 2, ..., n of the number of applications of each move that solves the knapsack problem:

$$\min \quad \sum_{i=1}^{n} p_i c_i$$

$$s.t. \quad \left\{\text{relevant projection of }\left(S + \sum_{i=1}^{n} p_i D_i\right)\right\} \geq 0$$

The above optimization problem can be solved by a variety of embodiments. In practice, since the number of moves being considered is small, even a brute force embodiment is often sufficient. The idea is to solve this problem "on the side" without triggering the timer to determine the best move or set of moves. This will make the overall timing closure process smoother and more efficient, while ensuring that all variations are addressed during the closure process.

While the invention has been described in accordance with certain preferred embodiments thereof, those skilled in the art will understand the many modifications and enhancements which can be made thereto without departing from the true scope and spirit of the invention, which is limited only by the claims appended below. It is further to be understood that the present embodiments can be extended to various situations: early and late slacks; different types of optimization moves; different combinations of optimization moves; different projections used for sign-off timing; and adapted to either statistical timing or multi-corner timing.

What is claimed is:

1. A method for achieving timing closure in a design of VLSI circuits in presence of manufacturing and environmental variations, the method comprising:
using a computer, employing a statistical timing analysis (STA) for identifying timing violations;
using statistical sensitivity information in canonical form for guiding an optimization, said statistical timing providing a fully parametrized canonical form of said identified timing violations, wherein each change to said circuit is pre-characterized in canonical form for defining goodness; and running said optimization to determine how much of said goodness is required to repair said identified timing violations.

2. The method of claim 1, further comprising determining from said canonical form a type of optimization to fix a timing violation, factoring said manufacturing and environmental variations.

3. The method of claim 2, further comprising implementing said optimization move types and repeating said timing analysis for quantifying improvements of said timing violations.

4. The method of claim 2 further comprising analyzing said canonical forms for prioritizing said optimization moves.

5. The method of claim 1, wherein said examining each of said timing violations comprises assessing a slack in canonical form corresponding to a failing timing test.

6. The method of claim 5, wherein examining said timing violations determines a predetermined type of move or set of moves known to fix said timing violations.

7. The method of claim 1, wherein said types of optimization moves include buffer insertion, pad cell insertion, metal layer assignment, pin swapping, and gate sizing.

8. The method of claim 1, further comprising iterating on a timing fail, and repeating said iteration to other timing fails.

9. The method of claim 1, wherein said optimization move is applied to statistical timing and multi-corner timing.

10. The method of claim 1 wherein said timing closure moves are evaluated using goodness functions to fix said timing violations.

11. The method of claim 10, further comprising combining a plurality of said moves to determine which combination of goodness functions is adequate to fix an original timing violation.

12. The method of claim 11 wherein said evaluations are made without triggering timing.

13. The method of claim 11 wherein determining from said canonical form said optimization move fixing said timing violation is determined for all relevant corners of a space of sources of said timing.

14. The method of claim 11 wherein a plurality of said optimization moves is evaluated simultaneously.

15. The method of claim 10 further comprising
combining said multiple moves to determine which combination of goodness functions is sufficient to fix said timing violations.

16. The method of claim 1 wherein in case of high metal sensitivity, buffers are inserted to be a promising type of move to fix said timing violation.

* * * * *